United States Patent
Haerle et al.

(10) Patent No.: US 6,825,123 B2
(45) Date of Patent: Nov. 30, 2004

(54) METHOD FOR TREATING SEMICONDUCTOR PROCESSING COMPONENTS AND COMPONENTS FORMED THEREBY

(75) Inventors: Andrew G. Haerle, Sutton, MA (US); Richard F. Buckley, Shrewsbury, MA (US); Richard R. Hengst, Oakham, MA (US)

(73) Assignee: Saint-Goban Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 10/414,563

(22) Filed: Apr. 15, 2003

(65) Prior Publication Data

US 2004/0209445 A1 Oct. 21, 2004

(51) Int. Cl.$^7$ ............................................. H01L 21/311
(52) U.S. Cl. ........................ 438/695; 438/694; 438/723
(58) Field of Search ................................. 438/694, 695, 438/723, 905, 906, 931

(56) References Cited

U.S. PATENT DOCUMENTS

| 6,066,572 A | * | 5/2000 | Lu et al. ...................... 438/774 |
| 6,093,644 A | | 7/2000 | Inaba et al. |
| 6,277,194 B1 | * | 8/2001 | Thilderkvist et al. ......... 117/94 |
| 6,379,575 B1 | * | 4/2002 | Yin et al. ...................... 216/67 |

OTHER PUBLICATIONS

Wolf et al., Silicon Processing for the VLSI Era, vol. 1: Process Teachnology, 1986, Lattice Press., pp. 213–216.*
Ghandhi, Sorab K., VLSI Fabrication Principles, Silicon and Gallium Arsenide, 1983, John Wiley and Sons, pp. 517–520.*

* cited by examiner

Primary Examiner—George Fourson
Assistant Examiner—Julio J. Maldonado
(74) Attorney, Agent, or Firm—Toler, Larson & Abel, LLP; Thomas G. Field, III

(57) ABSTRACT

A method for treating a semiconductor processing component, including: exposing the component to a halogen gas at an elevated temperature, oxidizing the component to form an oxide layer, and removing the oxide layer.

28 Claims, 1 Drawing Sheet

METHOD FOR TREATING SEMICONDUCTOR PROCESSING COMPONENTS AND COMPONENTS FORMED THEREBY

CROSS-REFERENCE TO RELATED APPLICATION(S)

BACKGROUND

1. Field of the Invention

The present invention is generally related to methods for treating semiconductor processing components for use in a semiconductor fabrication environment, as well as semiconductor processing components formed thereby.

2. Description of the Related Art

In the art of semiconductor processing, typically integrated circuit devices are formed through various wafer processing techniques, in which semiconductor (principally silicon) wafers are processed through various stations or tools. Processing operations include, for example, high temperature diffusion, thermal processing, ion implant, annealing, photolithography, polishing, deposition, etc. As new generation semiconductor devices are developed, there is an intense demand in the industry to achieve better and better purity levels during such processing operations. In addition, there continues to be an intense driving force in transitioning to larger and larger semiconductor wafers. Currently, the semiconductor industry is undergoing a transition from 200 mm to 300 mm wafers. The desire for superior purity levels and larger wafers introduces further integration challenges for next generation processing.

In this context, it has been found that as wafer size increases, the gravitational stresses caused by the increased mass of the wafers and increased surface area, cause what is understood as crystallographic slip in the semiconductor wafer. Crystallographic slip manifests itself as slip lines in the wafer which cause a decrease in device yield proportional with an increase in wafer size, and undermine some of the cost advantages associated with larger surface area wafers.

In an attempt to minimize crystallographic slip, wafers need to be more fully supported during processing operations. One technique is to machine the semiconductor processing components to provide a smooth finish particularly along those portions of the processing component that contact the wafer. Such processing components include semiconductor wafer jigs, horizontal and vertical wafer boats, and wafer carriers, for example. Typically, the improved surface finish can be accomplished by machining slots into a wafer carrier or jig. While appropriate surface finishes may be engineered into the semiconductor processing component utilizing existing technology, additional issues have arisen, and in particular, a decrease in purity and attendant increase in contamination of the processing component.

U.S. Pat. No. 6,093,644 discloses a process in which an oxidation step is carried out, followed by oxide layer removal. However, the techniques disclosed therein do not adequately address certain contamination issues, and appear to focus on global impurity levels of the component, and not impurity levels along critical portions of the component.

Despite improvements in the industry to address next generation purity concerns as well as handling issues associated with larger-sized semiconductor wafers, a need continues to exist in the art for further improved semiconductor processing components, methods for forming such components, and methods for processing semiconductor wafers.

SUMMARY

According to one aspect of the invention, a method for treating a semiconductor processing component is provided. According to the method, the semiconductor processing component is exposed to a halogen gas at an elevated temperature, and oxidized to form an oxide layer. After formation of the oxide layer, the oxide layer is removed.

According to another embodiment, a method for removing a contaminant from a semiconductor processing component is provided, in which the contaminant is reacted at an elevated temperature to form a reaction product, the component is oxidized to form an oxide layer, and the oxide layer is then removed.

According to another embodiment, a semiconductor processing component is provided. The semiconductor processing component contains silicon carbide, and has a surface roughness having an $R_a$ less than about 2 microns and an impurity content of less than about 1000 ppm along an outer portion of the component, as measured by SIMS depth profiling at a depth of 10 nm below the outer surface. This outer portion extends from an exposed outer surface of the component to a depth of about 0.5 microns below the exposed outer surface of the component. The outer portion may extend along a portion of the outer surface of the component, or extend over essentially the entirety of the outer surface of the component.

According to yet another embodiment, a semiconductor processing component is provided, the component having a machined surface, and an impurity content less than about 1000 ppm along an outer portion of the component, the outer portion being described above.

According to yet another embodiment, a semiconductor processing component is provided for receiving a semiconductor wafer. In this embodiment, the processing component is configured to contact and receive a semiconductor wafer. The component has surface roughness $R_a$ less than about 2 microns, and an impurity content less than about 1000 ppm along an outer portion of the component.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
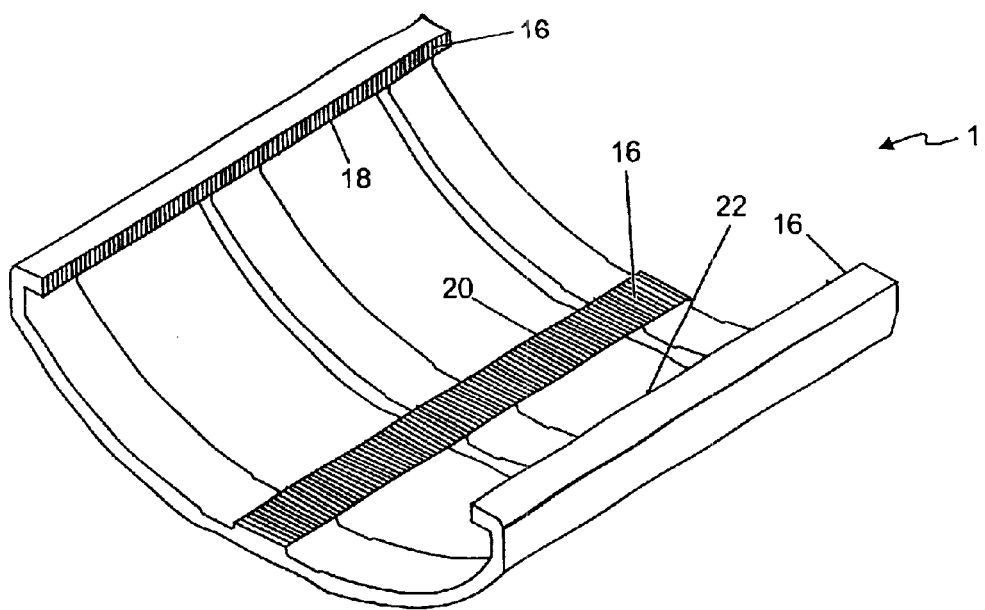
FIG. 1 illustrates an embodiment of the present invention, namely a wafer boat or carrier.

According to one aspect of the invention, a method for treating a semiconductor processing component is provided. The semiconductor processing component subject to treatment may be chosen from one of various geometric configurations for different processing operations, and may be configured for receiving various sized wafers, whether 150 mm, 200 mm, or newer generation 300 mm wafers, for example. Particular processing components include semiconductor wafer paddles, process tubes, wafer boats, liners, pedestals, long boats, cantilever rods, wafer carriers, vertical process chambers, and even dummy wafers. Of the foregoing, several of the semiconductor processing components may be those that are configured for direct contact with and for receiving semiconductor wafers such as horizontal or vertical wafer boats, long boats, and free-standing CVD SiC wafer susceptors. In addition, the processing component may be configured for single wafer processing and may be used for chambers, focus rings, suspension rings, susceptors, pedestals, etc.

The semiconductor processing component may be fabricated by various techniques. For example, according to one embodiment, the processing component is formed by provision of a silicon carbide substrate, which is then impregnated with molten elemental silicon. Optionally, the impregnated silicon carbide component may be coated with a high purity layer, such as silicon carbide by chemical vapor deposition (CVD). This deposited layer may advantageously prevent auto-doping of the underlying silicon, as well as prevent migration of impurities from the bulk of the substrate to an outer surface of the component, which may lead to contamination during semiconductor wafer processing. In this case, a silicon carbide member functioning as a core, for impregnation with molten silicon, provides the mechanical support of the component. This core may be manufactured by various techniques, most commonly slip casting silicon carbide, or by a pressing technique. Other specialized techniques may also be used, such as by utilizing a conversion process in which a carbon preform is converted into a silicon carbide core, or by subtractive process in which the core is removed following infiltration, such as by chemical vapor infiltration.

Alternatively, the semiconductor processing component may be formed of stand-alone silicon carbide, formed of one of various processes such as by CVD of silicon carbide. This particular process technique enables formation of a processing component that is of relatively high purity. Further, the processing component may be formed of a conventional material such as quartz. In this regard, quartz diffusion components have been utilized in the semiconductor industry for high temperature diffusion operations, and are a cost effective alternative to the more expensive but better performing silicon carbide-based diffusion components. However, features of the present invention may be particularly applicable to silicon carbide-based semiconductor processing components, such as those that are machined during the fabrication process, discussed in more detail below.

At the back-end of the fabrication process for forming a semiconductor processing component according to embodiments of the present invention, the component may be machined. In particular, as in the case of wafer boat 1 illustrated in FIG. 1, a wafer boat is provided having a plurality of grooves 16, each of which extends along the same radius of curvature. Each groove has an individual groove segment 18, 20 and 22, which are desirably machined following fabrication of the wafer boat proper. For example, the wafer boat may be fabricated according to one of the techniques described above, such as by impregnating a silicon carbide core with molten elemental silicon, then executing CVD to form a deposited silicon carbide layer. Following formation of the silicon carbide layer, the grooves may be formed and fine dimensional control may be executed by a machining operation, such as by utilizing a diamond-based machining tool. In this regard, while prior fabrication techniques have attempted to deal with impurity introduction during the machining stage by utilizing very high purity machining tools, features of the present invention enable utilization of a fairly wide range of machining tools and operations, as will be discussed below.

Noteworthy, while FIG. 1 illustrates a horizontal wafer boat, it is to be understood that vertical wafer boats or wafer carriers may be utilized as well, as well as other semiconductor processing components as already mentioned.

Following formation of the processing component, and optionally machining operations, the processing component is exposed to a halogen gas at an elevated temperature. Use of the term "halogen gas" denotes use of any halogen group elements provided in gaseous form, typically combined with a cation. An example of a common halogen gas which may be employed according to embodiments of the present invention includes HCl. Other gasses include those that contain fluorine, for example. Typically, the elevated temperature at which the semiconductor processing component is exposed to the halogen gas is sufficient to enable a reaction between the halogen gas and impurities contained along an outer surface portion of the semiconductor processing component, including along the exposed outer surface of the semiconductor processing component. For example, the elevated temperature may be within a range of about 950° C. to about 1300° C. Further, the concentration of the halogen gas may vary, and may be present in the heated environment (e.g., a furnace processing chamber) within a range of about 0.01 to about 10% of the total pressure. Typically, the lower limit of the partial pressure is somewhat higher, such as about 0.05, or about 0.10%.

Typically, the impurity with which the halogen gas reacts along an outer surface portion of the semiconductor processing component is a metal impurity. Metal impurities may take on the form of elemental metal, or metal alloys, and may be aluminum-based or iron-based, for example. The source of the metal impurity is oftentimes due to back-end machining, as discussed above. The actual composition of the machine tool may include a certain level of contaminants. Even more likely, the machining operation is carried out by use of an apparatus having structural metallic components which generate particulates, which eventually end up being deposited on or otherwise transferred to the processing component. As such, common impurities include those metals that are commonly used for formation of industrial machining tools, including tool steels. The use of a halogen gas such as HCl causes the formation of a reaction product with such metal impurities. The reaction product typically has a higher volatilization than the impurities, such that during the exposure of the processing component to the elevated temperature, the reaction product volatilizes and is thus removed from the processing component.

In connection with the foregoing impurity reduction of the components, it is noted that while the foregoing has primarily focused on silicon carbide components (including free standing CVD SiC, recrystallized CVD, Si-impregnated SiC), the impurity reduction techniques may be equally applicable to components formed of other materials, such as quartz. Whatever the base material of component, machined components such as those having a fine surface finish (as discussed in more detail hereinbelow), are particularly good candidates for impurity reduction.

The semiconductor processing component may also be subject to an oxidizing treatment, which may aid in further impurity reduction and/or particle count reduction, particularly in the case of silicon carbide components. The oxidation of the semiconductor processing component is carried out to form an oxide layer by chemical reaction to form a conversion layer, as opposed to a deposited oxide layer. The exposure of the processing component to halogen gas and the oxidation of the component may be carried out separately. However, in one embodiment, both the exposing and oxidizing steps are carried out simultaneously. In this regard, use of the term simultaneously does not require that the exposure and oxidation steps are carried out so as to be completely coextensive, but rather, the steps may overlap each other partially.

According to the oxidation treatment, an oxide layer is provided so as to overlie the semiconductor processing component. In this regard, the oxide layer may directly overlie and contact an underlying silicon carbide layer, such as in the case of chemical vapor deposited silicon carbide, or may directly overlie and contact elemental silicon, as in the case of siliconized silicon carbide processing components which do not have an overlying CVD SiC layer.

The oxide layer may be formed by oxidation of the component in an oxidizing environment, such as by oxidizing the component in an oxygen containing environment at an elevated temperature, such as within a range of 950 to about 1300 degrees C., and more generally in a range of about 1000 to about 1250 degrees C. Oxidation may be carried out in a dry or wet ambient, and is typically carried out at atmospheric pressure. A wet ambient can be generated by introducing steam, and functions to increase the rate of oxidation. The oxide layer is generally silicon oxide, typically $SiO_2$. The silicon oxide layer may be in direct contact with the silicon carbide of the component, as in the case of free-standing SiC or substrates coated with silicon carbide, such as by CVD. Alternatively, an intermediate layer, such as silicon may be present between the silicon carbide of the substrate and the overlying oxide layer, as in the case of silicon-impregnated silicon carbide, which has no SiC CVD layer.

According to embodiments of the present invention, formation of the oxide layer may cause residual silicon carbide particulates to be converted to silicon oxide, in addition to formation of an oxide layer along the body proper. In the case of particulate conversion, oxidation may enable later stage particulate removal. In addition, formation of an oxide coating by a conversion process, rather then a deposition process, helps trap residual impurities, such as metallic impurities, within the oxide layer, for removal along with the oxide layer. The oxide layer may be removed by exposure of the processing component to a solution that is capable of solubilizing (dissolving) the oxide layer. In one embodiment, the solution is an acid which contains fluorine. Typically, the pH of the solution is less than about 3.5, most typically less than about 3.0, with some embodiments being even more acidic, having a pH less than about 2.5. Alternatively, the solution may be basic, and exposed to the layer in conjunction with elevated temperatures (greater than room temp, but below H2O boiling point). Alternatively, high temperature and H2 gas, such as above 1000° C., may also be used.

According to another feature, the execution of exposing the processing component to a halogen gas, oxidizing the component to form an oxide layer, and removing the oxide layer, are all carried out prior to use of the processing component in a semiconductor fabrication environment. As such, the foregoing steps may be carried out off-site, separate from the semiconductor fabrication environment, such as by the manufacturer of the processing component. The processing component may be fully treated, then packaged in a hermetic shipping container for direct and immediate use in a fabrication environment. While the foregoing has focused on one cycle, the halogen gas treatment and/or oxidation and removal steps may be repeated several times to achieve the desired level of purity.

While the foregoing has mentioned use of a halogen gas, other reactive anion-containing reactants may be utilized, provided that the reactant is chosen so as to form a reaction product with expected metallic impurities, and that the reaction product has a higher volatility then that of the metallic impurity itself.

According to a variant, additional processing steps may be incorporated prior to exposure to the halogen species, oxidation, and oxide removal, with an aim to further reduce impurity levels. For example, the component may be rinsed, such as with deionized (DI) water, prior to exposure to halogen gas and subsequent processing. Agitation may be carried out during rinsing, such as with an ultrasonic mixer/agitator, to further supplement contaminant removal. Further, the rinsing solution may be acidic solution to aid in stripping the contaminants.

Alternatively, or in addition to rinsing, the component may be immersed in an acidic stripping solution prior to halogen species exposure, such as an acidic solution, to further aid in impurity removal. The rinsing and/or immersion steps may be repeated any number of times prior to further processing.

Further, semiconductor processing components having various features are provided according to embodiments of the present invention. For example, a processing component comprising silicon carbide is provided having a surface roughness $R_a$ less than about 2 microns, and an impurity content less than about 1000 ppm (as measured by SIMS depth profiling at depth of 10 nm below the outer surface) along an outer portion of the component. In the case of components which directly contact wafers, such as a supporting jig or wafer boat, the surface portion having the above noted $R_a$ typically includes at least that portion of the component configured for this contact, such as the slots in a wafer boat. The above noted outer portion having controlled purity is generally defined as a portion of the component extending from an exposed outer surface to a depth of about 0.5 microns as measured by SIMS depth profiling below the exposed outer surface. According to one embodiment, this outer portion extends along essentially the entire outer area of the component, and actual impurity level data taken from several locations which are taken as representative of the purity level of the outer portion. By execution of a machining step such as by utilizing a diamond grinding tool, the surface roughness may be reduced to an $R_a$ less than about 2 microns. Alternatively, different fabrication techniques may be used to form an as-formed processing component having such a surface roughness. Certain embodiments may have a surface roughness less than about 1.5 microns, such as less than about 1.0 microns.

The impurity content may be reduced to within the above-noted level along the outer portion of the component by following the process techniques described herein, for example. Preferably, this impurity content is less than about 500 ppm, preferably less than about 200 ppm. Certain embodiments have even a further suppressed impurity content, such as less than 100 ppm, and less than 80 ppm total. The foregoing impurties levels are the total impurity contents from the total of B, Na, Al, Ca, Ti, V, Cr, Fe, Ni, Cu. While prior processes have executed oxidation and oxidation layer removal steps as described above in the Background, the present inventor has recognized that such prior processes result in components having significant impurity levels, notably above the levels provided by present invention as described herein. Such prior techniques result in purity limits in excess of those desired for semiconductor industry applications. In addition, it has been found that processing component manufacturers have taken impurity contents across the entirety of the component (including through the bulk material), rather then along that portion which is particularly critical. This outer portion of the component is susceptible to undesirable diffusion into and contamination of the semiconductor fabrication environment. Accordingly, embodiments of the present invention do not only provide global impurity levels meeting or exceeding industry standards, but also suppress impurity levels along the critical outer surface portion of the component.

EXAMPLES

Table 1 shows the roughness results of CVD SiC samples prepared under a variety of conditions. Ra is defined as the average surface roughness. More precisely, it is the arithmetic mean of the departures of the profile from the mean line. $Ra = 1/L_o \int^L |Z(x)| dx$. Rz is defined as the average height difference between the five (5) highest peaks and the five (5) lowest valleys within the sampling length or stroke length (Stroke L). Stroke length is the length over which the values of surface roughness parameters were assessed.

Samples 1, 2, and 3 show roughness of as-deposited CVD SiC coatings. These results are obtained using a profilometer and using a 10 μm stylus and either a 3 to 6.4 mm stroke length. Samples 3, 4, 5, 6, and 7 are CVD SiC coatings that have undergone a surface treatment using diamond material, either by machining with a wheel or lapping and polishing with a diamond paste. As can be seen from the table, machining the CVD SiC acts to significantly reduce the surface roughness of the material. FS CVD denotes a free standing chemical vapor deposited component.

TABLE 1

| | Sample | Component | Treatment | Ra (μm) | Rz (μm) | Stroke L (mm) |
|---|---|---|---|---|---|---|
| As-deposited | 1 | V-rack | None | 3.5 | 18.7 | 6.4 |
| | 2 | V-rack | None | 2.1 | 15.9 | 6.4 |
| | 3 | FS CVD | None | 6.1 | | 3 |
| Machined | 4 | Column Boat | 320 grit | 0.13 | 2.2 | 3 |
| | 5 | FS CVD | 100 grit | 0.86 | 5.3 | 3 |
| | 6 | FS CVD | 320 grit | 0.28 | 2.5 | 3 |
| | 7 | FS CVD | Lapped | 0.14 | 1.75 | 3 |
| | 8 | FS CVD | Polished | 0.008 | 0.06 | 3 |

Table 2 shows surface purity results of an as-deposited CVD SiC film, and CVD SiC films that have undergone a post-machining step with a diamond tool. The surface purity is quantified using Secondary Ion Mass Spectroscopy (SIMS) at a nominal depth of 10 nm, and the following impurities made up the total: B, Na, Al, Ca, Ti, V, Cr, Fe, Ni, Cu. Sample 9 shows a fairly high-purity as-deposited coating. In contrast, after machining and rinsing with DI water, Sample 10 shows high contamination levels. In this regard, another sample subjected to machining and DI rinse showed even higher levels, on the order of 5000 ppm total. After being cleaned in an ultrasonic tank using DI water, Sample 11 was further processed using a chlorinated oxidation process. HCl concentration ranged from 1 to 3% based on oxygen through the cycle, and the maximum temperature was 1300° C. The oxide grown on Sample 11 was removed using a 4:1:1 DI Water:HF:HCl recipe (acid strip). SIMS data was obtained on this machined, treated CVD SiC film. It can be seen that the impurities were greatly reduced, and the purity is very close to the as-deposited condition.

Sample 12 was processed similarly to described above, except that a 4:1:1 DI water:HF:HCl immersion step was added after the ultrasonic DI rinse and prior to the chlorinated oxidation. As can be seen from the results, this methodology was effective in reducing the surface impurities on the machined CVD SiC material back to the initial starting level (as deposited).

TABLE 2

| Cleaning Method | Sample # | Total Impurities (ppm) |
|---|---|---|
| As-deposited (pre-machining) | 9 | 14.0 |
| Rinsed in ultrasonic DI (after machining) | 10 | 1295.6 |
| Oxidation w/Cl + Acid Strip | 11 | 27.6 |
| Acid Strip + Oxid. w/Cl + Acid Strip | 12 | 13.2 |

What is claimed is:

1. A method for treating a semiconductor processing component, comprising:
   exposing the component to a halogen gas;
   oxidizing the component to form an oxide layer; and
   removing the oxide layer, wherein the semiconductor component comprises silicon carbide.

2. The method of claim 1, wherein the steps of exposing the component to halogen gas and oxidizing the component are carried out simultaneously.

3. The method of claim 1, wherein the halogen gas comprises a halogen from the group consisting of chlorine and fluorine.

4. The method of claim 3, wherein the halogen gas comprises HCl.

5. The method of claim 1, wherein the halogen gas is present at a partial pressure within a range of about 0.01 to about 10%.

6. The method of claim 1, wherein the step of oxidizing the component is carried out at a temperature within a range of about 950 to about 1300 degrees C.

7. The method of claim 1, wherein the step of oxidizing is carried out in a wet ambient atmosphere.

8. The method of claim 1, wherein the semiconductor processing component has a metal impurity, and the halogen gas reacts with the metal impurity to form a reaction product which volatilizes during the step of exposing.

9. A method for treating a semiconductor processing component, comprising:
   exposing the component to a halogen gas;
   oxidizing the component to form an oxide layer; and
   removing the oxide layer, wherein the semiconductor processing component comprises a component from the group consisting of semiconductor wafer paddles, process tubes, wafer boats, liners, pedestals, long boats, cantilever rods, wafer carriers, process chambers, dummy wafers, wafer susceptors, focus rings, suspension rings.

10. The method of claim 1, wherein the semiconductor processing component is formed by chemical vapor deposition.

11. The method of claim 1, wherein the semiconductor processing component comprises a substrate and a silicon carbide coating overlying the substrate.

12. The method of claim 11, wherein the silicon carbide coating is deposited by chemical vapor deposition.

13. The method of claim 11, wherein the substrate comprises elemental silicon.

14. The method of claim 13, wherein the substrate comprises silicon carbide with said elemental silicon impregnated thereon.

15. The method of claim 1, wherein the step of removing the oxide layer is carried out by exposing the oxide layer to a solution to solubilize the oxide layer.

16. The method of claim 15, wherein the solution comprises HF.

17. The method of claim 15, wherein solution has a pH less then about 3.5.

18. A method for treating a semiconductor processing component, comprising:

machining the component by grinding the component with a diamond tool;

exposing the component to a halogen gas;

oxidizing the component to form oxide layer; and removing the oxide layer, wherein machining is carried out prior to the exposing and oxidizing.

19. A method for treating a semiconductor processing component, comprising:

exposing the component to a halogen gas;

oxidizing the component to form an oxide layer; and removing the oxide layer, wherein the oxide layer is removed prior to use in a semiconductor processing operation.

20. The method of claim 1, wherein the oxide layer is removed prior to putting the component into service as a semiconductor processing component.

21. The method of claim 1, further comprising a step of rinsing the component prior to exposing.

22. The method of claim 21, wherein the step of rinsing comprises rinsing with deionized water.

23. The method of claim 22, wherein the step of rinsing comprises rinsing with deionized water while agitating.

24. The method of claim 23, wherein agitating comprises exposing the component to an ultrasound treatment.

25. The method of claim 21, wherein the rinsing is carried out with an acidic solution.

26. The method of claim 1, further comprising a step of exposing the component to a stripping solution prior to exposure to halogen gas.

27. The method of claim 26, wherein the stripping solution comprises an acidic solution.

28. A method for a treating a semiconductor processing component, comprising:

reacting an impurity contained along a surface portion of the component, at an elevated temperature to form a reaction product, wherein the outer surface portion has a surface roughness less than about 2 microns, and the component has an impurity content of less than about 1000 ppm along said outer surface portion of the component as measured by SIMS at a depth of 10 nm from the surface of the component.

* * * * *